United States Patent
Huisman et al.

(10) Patent No.: US 12,282,263 B2
(45) Date of Patent: Apr. 22, 2025

(54) METROLOGY SYSTEM AND LITHOGRAPHIC SYSTEM

(71) Applicant: ASML Netherlands B.V., Veldhoven (NL)

(72) Inventors: Simon Reinald Huisman, Eindhoven (NL); Sebastianus Adrianus Goorden, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 109 days.

(21) Appl. No.: 18/036,788

(22) PCT Filed: Nov. 1, 2021

(86) PCT No.: PCT/EP2021/080241
§ 371 (c)(1),
(2) Date: May 12, 2023

(87) PCT Pub. No.: WO2022/106182
PCT Pub. Date: May 27, 2022

(65) Prior Publication Data
US 2023/0418168 A1    Dec. 28, 2023

(30) Foreign Application Priority Data
Nov. 17, 2020   (EP) ..................................... 20207987

(51) Int. Cl.
*G03F 7/00*    (2006.01)
*G03F 9/00*    (2006.01)

(52) U.S. Cl.
CPC ........ *G03F 7/70633* (2013.01); *G03F 9/7046* (2013.01); *G03F 9/7088* (2013.01); *G03F 9/7019* (2013.01)

(58) Field of Classification Search
CPC .. G03F 7/70633; G03F 9/7019; G03F 9/7046; G03F 9/7088
See application file for complete search history.

(56) References Cited

U.S. PATENT DOCUMENTS 6,636,311 B1   10/2003   Ina et al.
6,961,116 B2   11/2005   Den Boef et al.
(Continued)

FOREIGN PATENT DOCUMENTS

EP    4160314 A1 *   4/2023   ......... G03F 7/70633
JP    H10-326739 A   12/1998
(Continued)

OTHER PUBLICATIONS

International Search Report and Written Opinion of the International Searching Authority directed to International Patent Application No. PCT/EP2021/080241, mailed Feb. 23, 2022; 11 pages.
(Continued)

*Primary Examiner* — Peter B Kim
(74) *Attorney, Agent, or Firm* — Sterne, Kessler, Goldstein & Fox P.L.L.C.

(57) ABSTRACT

Disclosed is a metrology system comprising: a pre-alignment metrology tool operable to measure a plurality of targets on a substrate to obtain measurement data; and a processing unit. The processing unit is operable to: process said measurement data to determine for each target at least one position distribution which describes variation of said position value over at least part of said target; and determine a measurement correction from said at least one position distribution which corrects for within-target variation in each of said targets, said measurement correction for correcting measurements performed by an alignment sensor.

15 Claims, 6 Drawing Sheets

(56) References Cited

U.S. PATENT DOCUMENTS

| | | | |
|---|---|---|---|
| 8,139,217 | B2 | 3/2012 | Van Bilsen et al. |
| 11,262,661 | B2 | 3/2022 | Pandey et al. |
| 2003/0143761 | A1 | 7/2003 | Fukuda |
| 2004/0058540 | A1 | 3/2004 | Matsumoto et al. |
| 2005/0179898 | A1* | 8/2005 | Mishima ............... G03F 9/7084 356/401 |
| 2006/0033921 | A1 | 2/2006 | Den Boef et al. |
| 2006/0066855 | A1 | 3/2006 | Den Boef et al. |
| 2009/0195768 | A1 | 8/2009 | Bijnen et al. |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2012/0044470 | A1 | 2/2012 | Smilde et al. |
| 2012/0123581 | A1 | 5/2012 | Smilde et al. |
| 2013/0148121 | A1 | 6/2013 | Den Boef et al. |
| 2013/0258310 | A1 | 10/2013 | Smilde et al. |
| 2013/0271740 | A1 | 10/2013 | Quintanilha |
| 2015/0355554 | A1 | 12/2015 | Mathijssen |
| 2018/0329294 | A1 | 11/2018 | Tsujikawa |
| 2018/0329307 | A1 | 11/2018 | Brinkhof et al. |
| 2019/0064679 | A1 | 2/2019 | Egashira |
| 2019/0094721 | A1 | 3/2019 | Tinnemans et al. |
| 2019/0361358 | A1 | 11/2019 | Tel et al. |

FOREIGN PATENT DOCUMENTS

| | | |
|---|---|---|
| TW | 2020-18423 A | 5/2020 |
| WO | WO 2009/078708 A1 | 6/2009 |
| WO | WO 2009/106279 A1 | 9/2009 |
| WO | WO 2013/178422 A1 | 12/2013 |
| WO | WO 2014/019846 A2 | 2/2014 |
| WO | WO 2015/051970 A1 | 4/2015 |
| WO | WO 2018/114152 A1 | 6/2018 |
| WO | WO 2020/057900 A1 | 3/2020 |
| WO | WO 2020/224882 A1 | 11/2020 |

OTHER PUBLICATIONS

International Preliminary Report on Patentability directed to International Patent Application No. PCT/EP2021/080241, issued May 16, 2023; 8 pages.

Research Disclosure, "Metrology System and Lithographic System," Database No. 681029, Dec. 3, 2020; 34 pages.

Research Disclosure, "Metrology Method and Associated Metrology and Lithographic Apparatuses," Database No. 676001, Jun. 24, 2020; 30 pages.

* cited by examiner

METROLOGY SYSTEM AND LITHOGRAPHIC SYSTEM

CROSS-REFERENCE TO RELATED APPLICATIONS

This application claims priority of EP application 20207987.7 which was filed on 17 Nov. 2020, and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates more particularly to metrology sensors, such as position sensors.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In some metrology applications, such as in some scatterometers or alignment sensors, it is often desirable to be able to measure on increasingly smaller targets, while also maintaining compatibility with present, or larger target sizes.

Metrology targets or marks used for alignment typically comprise asymmetries due to processing effects and other issues which can undesirably impact the measured position, as can interaction between the non-ideal mark and a non-ideal sensor. It is desirable to improve accuracy of alignment methods on such imperfect targets.

SUMMARY OF THE INVENTION

The invention in a first aspect provides a metrology system comprising: a pre-alignment metrology tool operable to measure a plurality of targets on a substrate to obtain measurement data; and a processing unit being operable to: process said measurement data to determine for each target at least one position distribution which describes variation of said position value over at least part of said target; and determine a measurement correction from said at least one position distribution which corrects for within-target variation in each of said targets, said measurement correction for correcting measurements performed by an alignment sensor The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
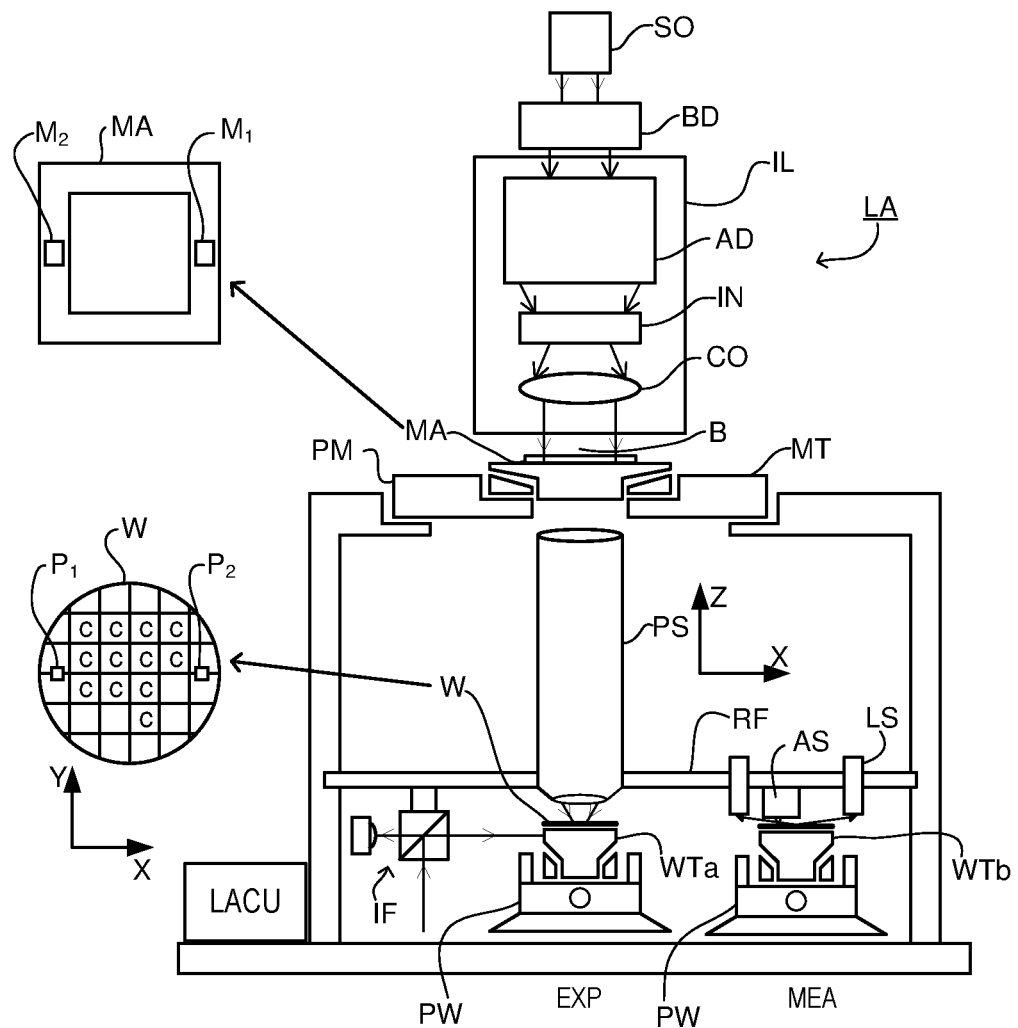
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
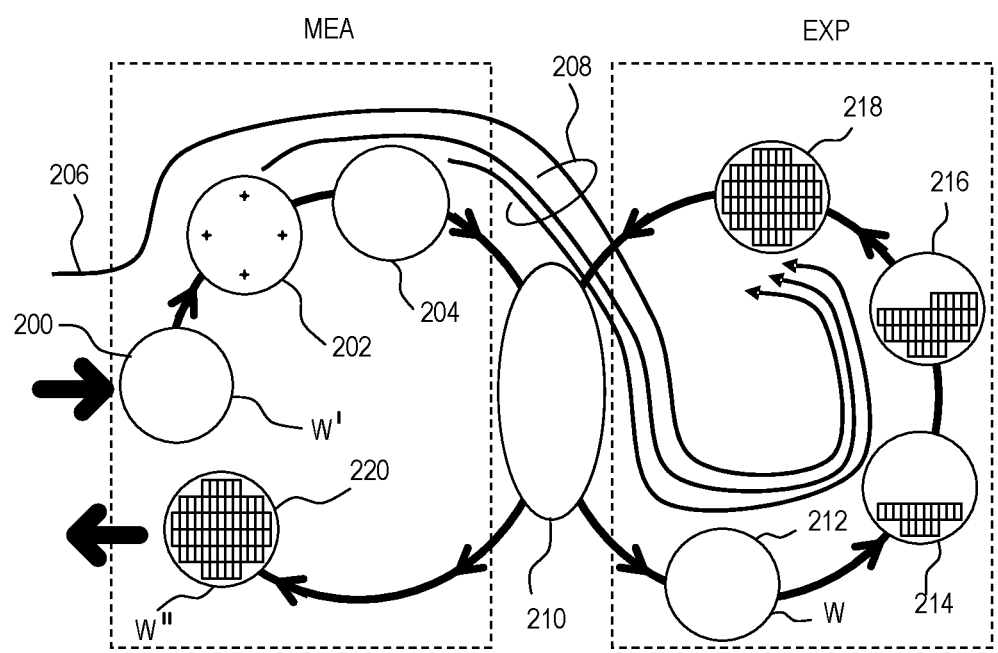
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W'' is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

A specific type of metrology sensor, which as both alignment and product/process monitoring metrology applications is described in PCT patent application WO 2020/057900 A1, which is incorporated herein by reference. This describes a metrology device with optimized coherence. More specifically, the metrology device is configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions.

Such a metrology device is able to measure small pitch targets with acceptable (minimal) interference artifacts (speckle) and will also be operable in a dark-field mode. Such a metrology device may be used as a position or alignment sensor for measuring substrate position (e.g., measuring the position of a periodic structure or alignment mark with respect to a fixed reference position). However, the metrology device is also usable for measurement of overlay (e.g., measurement of relative position of periodic structures in different layers, or even the same layer in the case of stitching marks). The metrology device is also able to measure asymmetry in periodic structures, and therefore could be used to measure any parameter which is based on a target asymmetry measurement (e.g., overlay using diffraction based overlay (DBO) techniques or focus using diffraction based focus (DBF) techniques).

Figure 3:
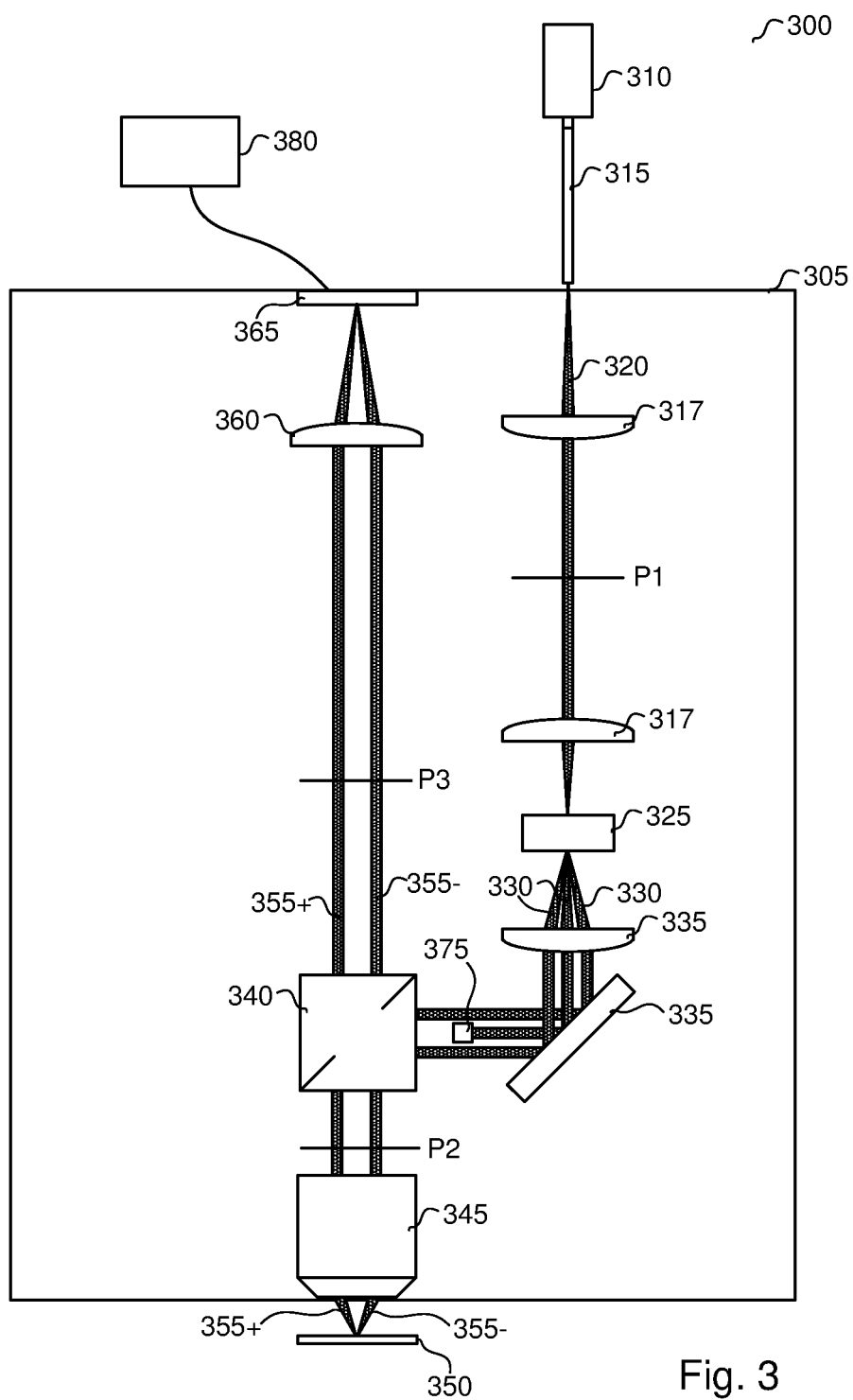
FIG. 3 is a schematic illustration of an example metrology device adaptable according to an embodiment of the invention.

FIG. 3 shows a possible implementation of such a metrology device. The metrology device essentially operates as a standard microscope with a novel illumination mode. The metrology device 300 comprises an optical module 305 comprising the main components of the device. An illumination source 310 (which may be located outside the module 305 and optically coupled thereto by a multimode fiber 315) provides a spatially incoherent radiation beam 320 to the optical module 305. Optical components 317 deliver the spatially incoherent radiation beam 320 to a coherent off-axis illumination generator 325. This component is of particular importance to the concepts herein and will be described in greater detail. The coherent off-axis illumination generator 325 generates a plurality (e.g., four) off-axis beams 330 from the spatially incoherent radiation beam 320. The characteristics of these off-axis beams 330 will be described in detail further below. The zeroth order of the illumination generator may be blocked by an illumination zero order block element 375. This zeroth order will only be present for some of the coherent off-axis illumination generator examples described in this document (e.g., phase grating based illumination generators), and therefore may be omitted when such zeroth order illumination is not generated. The off-axis beams 330 are delivered (via optical components 335 and) a spot mirror 340 to an (e.g., high NA) objective lens 345. The objective lens focusses the off-axis beams 330 onto a sample (e.g., periodic structure/alignment mark) located on a substrate 350, where they scatter and diffract. The scattered higher diffraction orders 355+, 355− (e.g., +1 and −1 orders respectively), propagate back via the spot mirror 340, and are focused by optical component 360 onto a sensor or camera 365 where they interfere to form an interference pattern. A processor 380 running suitable software can then process the image(s) of the interference pattern captured by camera 365.

The zeroth order diffracted (specularly reflected) radiation is blocked at a suitable location in the detection branch; e.g., by the spot mirror 340 and/or a separate detection zero-order block element. It should be noted that there is a zeroth order reflection for each of the off-axis illumination beams, i.e. in the current embodiment there are four of these zeroth order reflections in total. An example aperture profile suitable for blocking the four zeroth order reflections is shown in FIGS. 4(b) and (c), labelled 422. As such, the metrology device operated as a "dark field" metrology device.

A main concept of the proposed metrology device is to induce spatial coherence in the measurement illumination only where required. More specifically, spatial coherence is induced between corresponding sets of pupil points in each of the off-axis beams 330. More specifically, a set of pupil points comprises a corresponding single pupil point in each of the off-axis beams, the set of pupil points being mutually spatially coherent, but where each pupil point is incoherent with respect to all other pupil points in the same beam. By optimizing the coherence of the measurement illumination in this manner, it becomes feasible to perform dark-field off-axis illumination on small pitch targets, but with minimal speckle artifacts as each off-axis beam 330 is spatially incoherent.

Figure 4:
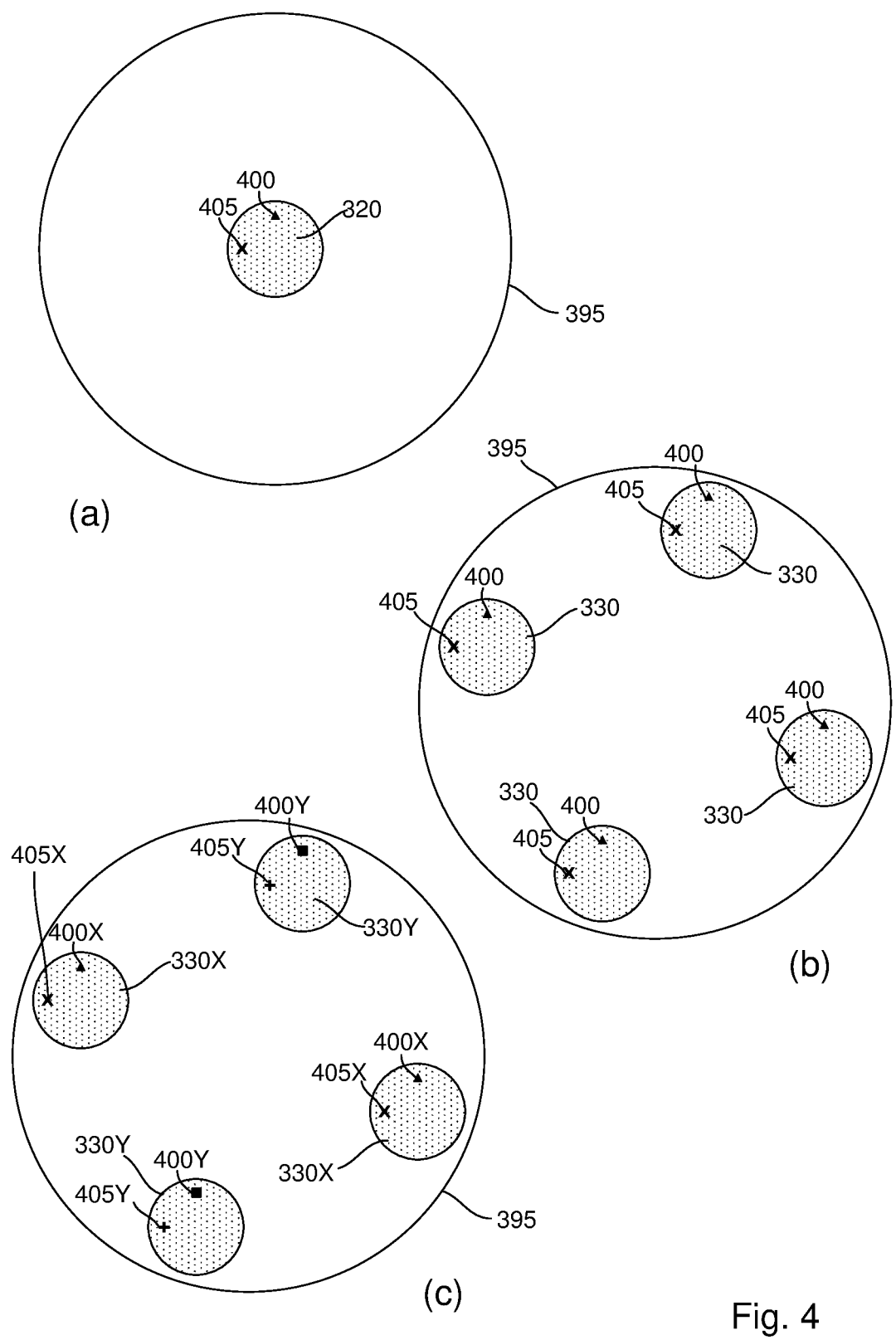
FIG. 4 comprises (a) a pupil image of input radiation (b) pupil image of off-axis illumination beams illustrating an operational principle of the metrology device of FIG. 3; and (c) pupil image of off-axis illumination beams illustrating another operational principle of the metrology device of FIG. 3.

FIG. 4 shows three pupil images to illustrate the concept. FIG. 4(a) shows a first pupil image which relates to pupil plane P1 in FIG. 2, and FIGS. 4(b) and 4(c) each show a second pupil image which relates to pupil plane P2 in FIG. 2. FIG. 4(a) shows (in cross-section) the spatially incoherent radiation beam 320, and FIGS. 4(b) and 4(c) show (in cross-section) the off-axis beams 330 generated by coherent off-axis illumination generator 325 in two different embodiments. In each case, the extent of the outer circle 395 corresponds to the maximum detection NA of the microscope objective; this may be, purely by way of an example 0.95 NA.

The triangles 400 in each of the pupils indicate a set of pupil points that are spatially coherent with respect to each other. Similarly, the crosses 405 indicate another set of pupil points which are spatially coherent with respect to each other. The triangles are spatially incoherent with respect to crosses and all other pupil points corresponding to beam propagation. The general principle (in the example shown in FIG. 4(b)) is that each set of pupil points which are mutually spatially coherent (each coherent set of points) have identical spacings within the illumination pupil P2 as all other coherent sets of points. As such, in this embodiment, each coherent sets of points is a translation within the pupil of all other coherent sets of points.

In FIG. 4(b), the spacing between each pupil point of the first coherent set of points represented by triangles 400 must be equal to the spacing between each pupil point of the coherent set of points represented by crosses 405. 'Spacing' in this context is directional, i.e., the set of crosses (second set of points) is not allowed to be rotated with respect to the set of triangles (first set of points). As such, each of the off-axis beams 330 comprises by itself incoherent radiation; however the off-axis beams 330 together comprise identical beams having corresponding sets of points within their cross-section that have a known phase relationship (spatial coherence). It should be noted that it is not necessary for the points of each set of points to be equally spaced (e.g., the spacing between the four triangles 405 in this example is not required to be equal). As such, the off-axis beams 330 do not have to be arranged symmetrically within the pupil.

FIG. 4(c) shows that this basic concept can be extended to providing for a mutual spatial coherence between only the beams corresponding to a single measurement direction where beams 330X correspond to a first direction (X-direction) and beams 330Y correspond to a second direction (Y-direction). In this example, the squares and plus signs each indicate a set of pupil points which correspond to, but are not necessarily spatially coherent with, the sets of pupil points represented by the triangles and crosses. However, the crosses are mutually spatially coherent, as are the plus signs, and the crosses are a geometric translation in the pupil of the plus signs. As such, in FIG. 4(c), the off-axis beams are only pair-wise coherent.

In this embodiment, the off-axis beams are considered separately by direction, e.g., X direction 330X and Y direction 330Y. The pair of beams 330X which generate the captured X direction diffraction orders need only be coherent with one another (such that pair of points 400X are mutually coherent, as are pair of points 405X). Similarly the pair of beams 330Y which generate the captured Y direction diffraction orders need only be coherent with one another (such that pair of points 400Y are mutually coherent, as are pair of points 405Y). However, there does not need to be coherence between the pairs of points 400X and 400Y, nor between the pairs of points 405X and 405Y. As such there are pairs of coherent points comprised in the pairs of off-axis beams corresponding to each considered measurement direction. As before, for each pair of beams corresponding to a measurement direction, each pair of coherent points is a geometric translation within the pupil of all the other coherent pairs of points.

Figure 5:
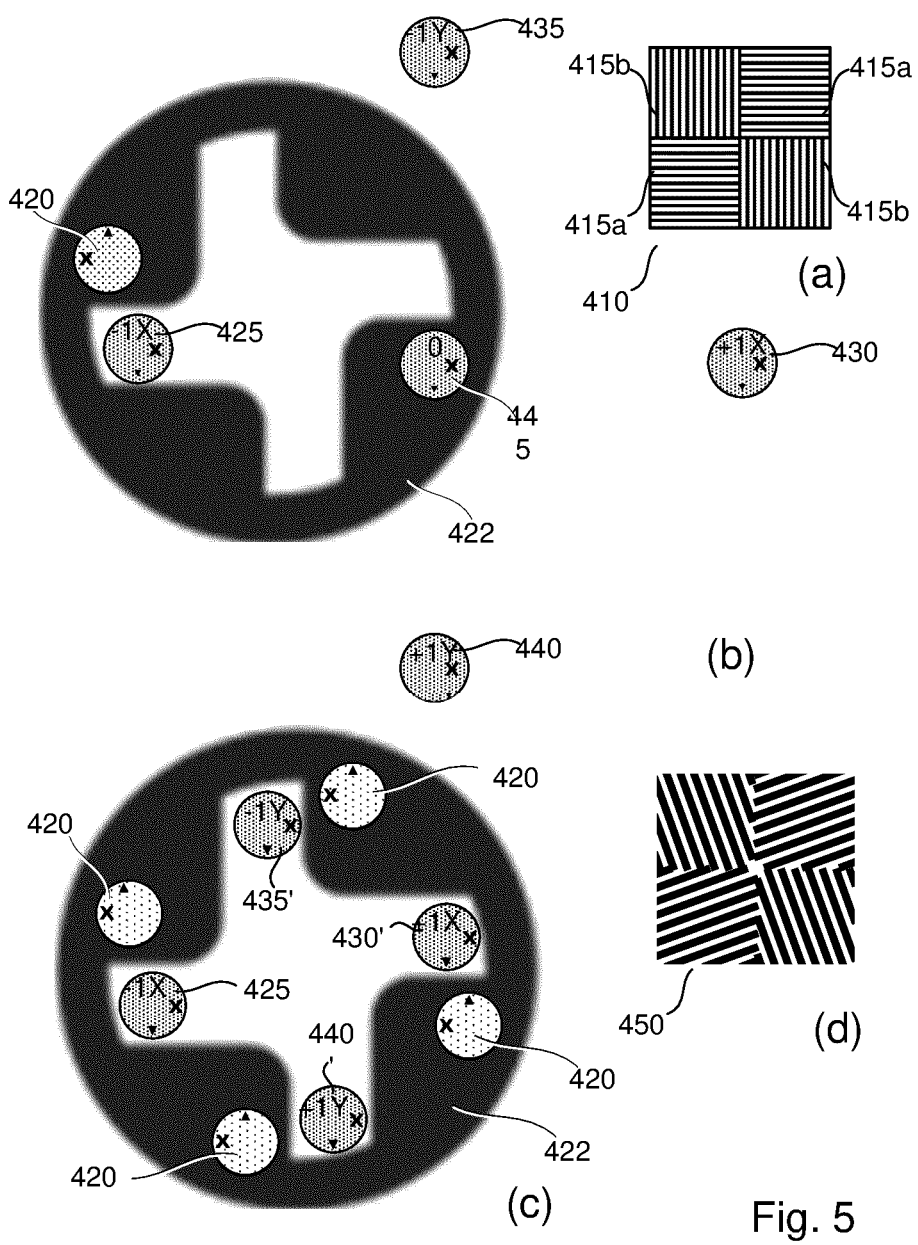
FIG. 5 shows (a) an example target usable in alignment, (b) a pupil image of the detection pupil corresponding to detection of a single order, (c) a pupil image of the detection pupil corresponding to detection of four diffraction orders, and (d) a schematic example of an imaged interference pattern following measurement of the target of FIG. 4(a)

FIG. 5 illustrates the working principle of the metrology system, e.g., for alignment/Position sensing. FIG. 5(a) illustrates a target 410 which can be used as an alignment mark in some embodiments. The target 410 may be similar to those used in micro diffraction based overlay techniques (μDBO), although typically comprised only in a single layer when forming an alignment mark. As such, the target 410 comprises four sub-targets, comprising two gratings (periodic structures) 415a in a first direction (X-direction) and two gratings 415b in a second, perpendicular, direction (Y-direction). The pitch of the gratings may comprise an order of magnitude of 100 nm (more specifically within the range of 300-800 nm), for example.

FIG. 5(b) shows a pupil representation corresponding to (with reference to FIG. 2) pupil plane P3. The Figure shows the resulting radiation following scattering of only a single one of the off-axis illumination beams, more specifically (the left-most in this representation) off-axis illumination beam 420 (which will not be in this pupil, its location in pupil plane P2 corresponds to its location in the illumination pupil and is shown here only for illustration). The shaded region 422 corresponds to the blocking (i.e., reflecting or absorbing) region of a specific spot mirror design (white represents the transmitting region) used in an embodiment. Such a spot mirror design is purely an example of a pupil block which ensures that undesired light (e.g. zeroth orders and light surrounding the zeroth orders) are not detected. Other spot mirror profiles (or zero order blocks generally) can be used.

As can be seen, only one of the higher diffraction orders is captured, more specifically the −1 X direction diffraction order 425. The +1 X direction diffraction order 430, the −1 Y direction diffraction order 435 and the +1 Y direction diffraction order 440 fall outside of the pupil (detection NA represented by the extent of spot mirror 422) and are not captured. Any higher orders (not illustrated) also fall outside the detection NA. The zeroth order 445 is shown for illustration, but will actually be blocked by the spot mirror or zero order block 422.

FIG. 5(c) shows the resultant pupil (captured orders only) resultant from all four off-axis beams 420 (again shown purely for illustration). The captured orders include the −1 X direction diffraction order 425, a +1 X direction diffraction order 430', a −1 Y direction diffraction order 435' and a +1 Y direction diffraction order 440'. These diffraction orders are imaged on the camera where they interfere forming a fringe pattern 450, such as shown in FIG. 5(d). In the example shown, the fringe pattern is diagonal as the diffracted orders are diagonally arranged in the pupil, although other arrangements are possible with a resulting different fringe pattern orientation.

In a manner similar to other metrology devices usable for alignment sensing, a shift in the target grating position causes a phase shift between the +1 and −1 diffracted orders per direction. Since the diffraction orders interfere on the camera, a phase shift between the diffracted orders results in a corresponding shift of the interference fringes on the camera. Therefore, it is possible to determine the alignment position from the position of the interference fringes on the camera.

Figure 6:
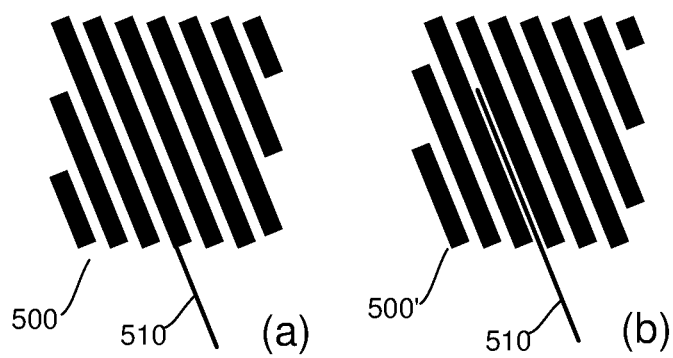
FIG. 6 shows schematically during an alignment measurement, an imaged interference pattern corresponding to (a) a first substrate position and (b) a second substrate position.

FIG. 6 illustrates how the alignment position can be determined from the interference fringes. FIG. 6(a) shows one set of interference fringes 500 (i.e., corresponding to one quadrant of the fringe pattern 450), when the target is at a first position and FIG. 6(b) the set of interference fringes 500' when the target is at a second position. A fixed reference line 510 (i.e., in the same position for both images) is shown to highlight the movement of the fringe pattern between the two positions. Alignment, can be determined by comparing a position determined from the pattern to a position obtained from measurement of a fixed reference (e.g., transmission image sensor (TIS) fiducial) in a known manner. A single fringe pattern (e.g., from a single grating alignment mark), or single pattern per direction (e.g., from a two grating alignment mark), can be used for alignment. Another option for performing alignment in two directions may use an alignment mark having a single 2D periodic pattern. Also, non-periodic patterns could be measured with the metrology device described herein. Another alignment mark option may comprise a four grating target design, such as illustrated in FIG. 5(a), which is similar to that commonly used for measuring overlay, at present. As such, targets such as these are typically already present on wafers, and therefore similar sampling could be used for alignment and overlay. Such alignment methods are known and will not be described further.

WO 2020/057900 further describes the possibility to measure multiple wavelengths (and possibly higher diffraction orders) in order to be more process robust (facilitate measurement diversity). It was proposed that this would enable, for example, use of techniques such as optimal color weighing (OCW), to become robust to grating asymmetry. In particular, target asymmetry typically results in a different aligned position per wavelength. Thereby, by measuring this difference in aligned position for different wavelengths, it is possible to determine asymmetry in the target. In one embodiment, measurements corresponding to multiple wavelengths could be imaged sequentially on the same camera, to obtain a sequence of individual images, each corresponding to a different wavelength. Alternatively, each of these wavelengths could be imaged in parallel on separate cameras (or separate regions of the same camera), with the wavelengths being separated using suitable optical components such as dichroic mirrors. In another embodiment, it is possible to measure multiple wavelengths (and diffraction orders) in a single camera image. When illumination beams corresponding to different wavelengths are at the same location in the pupil, the corresponding fringes on the camera image will have different orientations for the different wavelengths. This will tend to be the case for most off-axis illumination generator arrangements (an exception is a single grating, for which the wavelength dependence of the illumination grating and target grating tend to cancel each other). By appropriate processing of such an image, alignment positions can be determined for multiple wavelengths (and orders) in a single capture. These multiple positions can e.g. be used as an input for OCW-like algorithms.

Also described in WO 2020/057900 is the possibility of variable region of interest (ROI) selection and variable pixel weighting to enhance accuracy/robustness. Instead of determining the alignment position based on the whole target image or on a fixed region of interest (such as over a central region of each quadrant or the whole target; i.e., excluding edge regions), it is possible to optimize the ROI on a per-target basis. The optimization may determine an ROI, or plurality of ROIs, of any arbitrary shape. It is also possible to determine an optimized weighted combination of ROIs, with the weighting assigned according to one or more quality metrics or key performance indicators (KPIs).

Targets generally, and small targets in particular, typically suffer deformations during their formation (e.g., due to processing and/or exposure conditions). In many cases, these deformations are not uniform within the target, but instead comprise multiple local or within-target effects leading to local or within-target variation; e.g., random edge effects, wedging over the mark, local grating asymmetry variations, local thickness variations and/or (local) surface roughness. These deformations may not repeat from mark-to-mark or wafer-to-wafer, and therefore should to be measured and corrected prior to exposure to avoid misprinting the device. Due to these local effects, when performing substrate alignment on deformed marks, simply averaging over the whole mark or over a fixed region of interest will typically lead to alignment errors.

The tool disclosed in WO 2020/057900, is described (in an alignment context) as an alignment sensor for measurement of alignment/position of a wafer prior to exposure (e.g., to determine an exposure grid based on measurement of alignment marks). Such a tool may be incorporated within a measurement station of a two-stage lithography exposure device or scanner for example.

However, there are commercial and/or practical challenges to replacing presently used alignment sensors (e.g., based on a self-referencing interferometer (SRI) principle) with an optimized coherence metrology tool such as that described in WO 2020/057900. In particular, it is highly desirable to maintain backward compatibility with present systems, which may be difficult with an optimized coherence metrology tool.

As such, a stand-alone pre-alignment tool and method is disclosed which can provide a within-target correction for another alignment tool, which corrects for alignment mark defects for example. The pre-alignment tool may be an optimized coherence metrology tool (e.g., based on the teachings of WO 2020/057900) or any other tool capable of obtaining a local position measurement (e.g., a position distribution or local position map) from a target. A position distribution may describe variation of aligned position over a target or at least part of the target (or a captured image thereof); e.g., a local position per pixel or per pixel group (e.g., groups of neighboring pixels).

The position distribution can then be used to determine an alignment correction (e.g., a feed-forward correction) for an alignment measurement performed, for example, using a more conventional (e.g., SRI based) alignment sensor. Such an alignment sensor may (or not) be comprised within a measurement station incorporated within a scanner.

In an embodiment, the pre-alignment tool may have a simplified stage arrangement and stability compared to an alignment sensor; e.g., a stage which does not have the required control accuracy and/or stability required for alignment (e.g., for an alignment sensor comprised within a scanner). Such a tool may have stability and stage capability similar to (e.g., stand-alone) metrology stations presently used for e.g., overlay metrology (e.g., scatterometer devices). As such, the pre-alignment tool is conceptually different to an external alignment sensor or complementary alignment tool which has the stage capability sufficient to measure a wafer coordinate system, spanning multiple targets. For an alignment sensor or complementary alignment tool, determining the actual target location of each measurement is essential in order to avoid any errors in the coordinate system (basically every target is referenced to each other target in order to span the coordinate system). This type of known complementary alignment tool may be used, for example, in combination with a scanner alignment sensor to enable the measurement of a large number of targets to measure a coordinate system. This densely measured coordinate system is fed-forward to the scanner, meaning that fewer targets need be measured within the scanner itself. By contrast, the pre-alignment tool disclosed herein is not necessarily configured for measuring a wafer coordinate system, instead it is proposed that the tool only measure individual targets and consider parameters for each target which are referenced only to its corresponding target. These parameters can then be fed forward to the scanner to improve the accuracy per target of the alignment sensor measurements.

Figure 7:
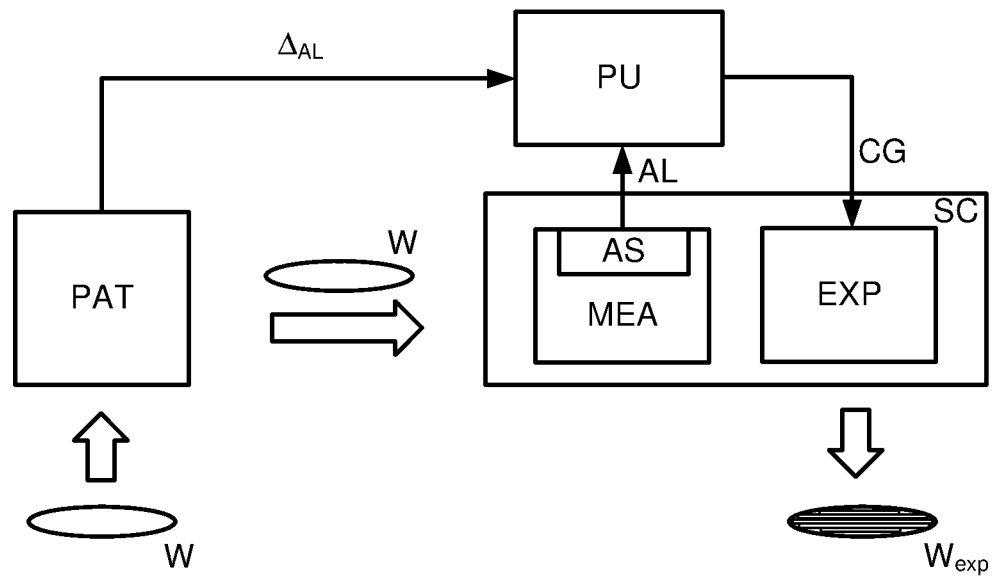
FIG. 7 is a flow diagram of a method according to an embodiment of the invention.

FIG. 7 is a schematic flow diagram of a system and/or method employing a pre-alignment tool PAT according to an embodiment. The pre-alignment tool should be of a type able to provide local within-target position (e.g., position data as a function of target position). For example, the pre-alignment tool may form an image which directly represents a position pattern or position distribution. Such a tool may be an optimized coherence metrology tool such as described in relation to FIGS. 3 to 6, or any other suitable tool; e.g., any other suitable optical microscope (dark field or bright field) or any suitable scanning probe microscopy tool (e.g., an atomic force microscope (AFM), a near-field microscope (NFM), a scanning electron microscope (SEM), an acoustic microscope, a scanning tunneling microscope (STM) or other similar technology able to provide position data as a function of target position). Scanning diffraction based alignment sensors may also be used for pre-alignment tool PAT. These alignment sensors measure interferograms based on a line trace over a mark rather than an 'image' or a 'map' from which a position is extracted. This line trace, which describes intensity as a function of position, yields an interferogram from which the aligned position is determined. In the context of this disclosure, the interferogram may be interpreted as a position distribution; i.e., a 1D position map. Many of these apparatuses also measure corresponding intensity asymmetries and therefore can also determine a non-position parameter distribution. Another example of a scanning sensor is an atomic force microscope (AFM); the AFM cantilever raster scans over the surface resulting in a 'topography picture'.

The pre-alignment tool PAT can determine an alignment correction $\Delta_{AL}$, based on measurement of a wafer W (comprising at least alignment marks or targets thereon; e.g., exposed in a previous layer or base layer). Methods for determining alignment correction $\Delta_{AL}$, will be described below. The same wafer is then fed into a measurement station MEA comprising an alignment sensor AS. The measurement station may be comprised within a scanner SC as depicted here, or may be comprised within a separate (stand-alone) alignment station or single station scanner. The alignment sensor measures the alignment marks on the wafer W to obtain alignment data AL. The alignment data AL may, for example, comprise a single alignment value per mark, or (depending on the system) multiple alignment values comprising an alignment value per wavelength (or other measurement setting) for each mark. However, the alignment sensor does not need and may lack the capability of measuring within mark position variation. A processing unit PU may then determine a control grid CG from both the alignment data AL and alignment correction $\Delta_{AL}$, e.g., such that the alignment data AL and/or (ultimately) the control grid CG is corrected for within-target deformation. This corrected control grid CG is then used at the exposure station EXP of the scanner SC to expose the next layer, thereby producing an exposed wafer $W_{exp}$.

Note that the representation of processing unit PU as a single processor outside of the scanner is purely an example. The processing may be performed by a processor within the scanner, for example. The processing may be distributed over multiple processors inside and/or outside the scanner or any other tool used. The processing unit may receive the raw image data from the pre-alignment tool PAT and determine alignment correction $\Delta_{AL}$, or this processing may be performed within the pre-alignment tool PAT as depicted here. The skilled person will readily appreciate that other processing arrangements and strategies may also be applied.

A proposed method may comprise the following steps to determine alignment correction $\Delta_{AL}$. In a first step, the pre-alignment tool is used to measure each mark to obtain within-target metrology data such as one or more position distributions (e.g., position data as a function of target position such as per-pixel or per-group of pixels position data). Multiple position distributions per target may be obtained for different measurement settings for example. The position distributions may be obtained, for example, by measuring the fringe position individually for each pixel or each group of neighboring pixels to obtain a per-pixel/per-group-of-pixels position (it is not always possible to assign a position from a single pixel). The image may relate to different sensor settings sensitive to mark-deformations, such as, multiple wavelengths/polarization states (or else separate images for different wavelengths/polarization states may be obtained), and a local position map may be determined for each of the wavelengths/polarization states.

Other non-position parameter distribution data can also optionally be measured using the pre-alignment tool and/or another metrology tool; and again may comprise multiple distributions per target, obtained for different measurement settings. Such a non-position parameter distribution may comprise a per-pixel intensity asymmetry (e.g., the difference in intensity between complementary diffraction orders (optionally normalized by the sum of these intensities, optionally calibrated to compensate for tool imperfections and/or optionally pre-processed to compensate for nominal stack properties)). Alternatively, such per-pixel intensity asymmetry information may be obtained using a different apparatus or tool such as a scatterometry based metrology tool. Other non-position parameters which may be measured from the pre-alignment tool or a different tool include one or more of (per pixel or pixel group): fringe visibility of an alignment pattern within an image, local intensity, wafer quality, and amplitude of an alignment pattern.

Once the position distributions/other distributions are acquired, two position values may be determined for each mark, a first representative correction value $X_{RE}$ and a second corrected position value $X_{CO}$. The representative correction value $X_{RE}$ may represent the value which the alignment sensor AS will "see" during alignment (e.g., an estimate of the alignment sensor AS readout on the same targets). This may comprise an average (e.g., mean) of the measured position distribution(s), for example. The representative correction value $X_{RE}$ has no correction for within-target variations (although it may optionally include corrections for non-local effects which the alignment sensor may also perform, particularly if the pre-alignment tool has increased capability over the alignment sensor, e.g., it can measure with more colors). The corrected position value $X_{CO}$ may comprise a position value which has been corrected for within-target variation. Exemplary methods for doing this are described herein.

The alignment correction $\Delta_{AL}$ may be determined as a difference or other comparison of these two position values (e.g., $\Delta_{AL}=X_{RE}-X_{CO}$). This alignment correction may comprise combined data from multiple measurement settings (e.g., the position data $X_{RE}-X_{CO}$ each relate to multiple measurement settings). The alignment correction $\Delta_{AL}$ may therefore comprise a correction value per target or alignment mark. This correction may essentially comprise a correction which an alignment sensor might apply if it had within-target measurement capability (e.g., it could resolve local deformations). In some embodiments, multiple alignment correction $\Delta_{AL}$ values may be determined per target, with each of these being forwarded to the processing unit PU. For example, an alignment correction $\Delta_{AL}$ value may be determined for every measured color and polarization.

The alignment sensor AS can be used to perform alignment, obtaining alignment data AL. Within the processing unit PU and/or scanner SC, a value for $\Delta_{AL}$ corresponding to each target is applied to the respective measured alignment value for that target to correct the alignment data AL for local deformation effects.

It may be noted that both positions $X_{RE}$ and $X_{CO}$ (measured by the pre-alignment tool) may have an arbitrary offset with respect to the position $X_{RE}$ measured by the alignment sensor in the scanner. However, alignment correction $\Delta_{AL}$ should not be affected by this offset, because it cancels out. One possible reason for such offset can be the relatively low accuracy of the wafer stage in the pre-alignment tool, which causes the mark to be measured at a slightly different position with respect to the sensor.

To determine the alignment correction $\Delta_{AL}$ and/or corrected position $X_{CO}$, a weighting may be determined using only the pre-alignment tool images (i.e., measurements on the target itself) although embodiments which use other data from other sources are also disclosed and fall within the present scope.

It is proposed that the alignment correction $\Delta_{AL}$ and/or corrected position $X_{CO}$ can be determined from combined local per-pixel information from at least one parameter distributions (parameter per-pixel maps) which each describe variation of a parameter value over at least corresponding parts of one or more captured images (e.g., each parameter distribution relates to a common region of interest of a target) and where at least one of the parameter distributions comprises a position distribution (or local position map).

In one embodiment, the alignment correction $\Delta_{AL}$ may be determined as a difference between two statistical measures of the same position distribution. For example, representative position $X_{RE}$ may comprise a mean of its respective position distribution (per target) and the corrected position $X_{CO}$ may comprise a median of the same position distribution. This may be useful as many present alignment sensors cannot determine a median, while a median is a useful statistical tool to remove outliers from a distribution.

A further method for determining the corrected position $X_{CO}$ will now be described in more detail. Such a method may comprise finding the optimal coefficients C and (optionally) D which minimize the within-target variations in a combined corrected position distribution or corrected position distribution map $X_{COmap}$ described by:

$$X_{COmap} = \Sigma C_{\lambda,P} \hat{x}_{\lambda,P} + \Sigma D_{\lambda,P} \hat{O}_{\lambda,P} \qquad \text{Equation 1}$$

where $\lambda$ is the wavelength index, P is the polarization index, $\hat{x}$ is the position distribution (local position per pixel/pixel group), C is a weighting factor for the position distribution, $\hat{O}$ is a non-position parameter distribution which correlates with target deformation and D is a weighting factor for the non-position parameter distribution. As such the combined corrected position map $X_{COmap}$ may be evaluated for all sensor settings applicable for the pre-alignment tool(s) used (here various wavelengths $\lambda$ and polarizations P). The weighting factors may be determined by minimizing a within-target variation metric in the overall combined distribution, forming a self-referenced method.

Equation 1 is purely an example of an equation for a combined corrected position map $X_{COmap}$. In another embodiment, for example, only position distributions are used and therefore the second term is unnecessary and the combined corrected position map $X_{COmap}$ can be determined from only the first term (and therefore to only find weighting C). In another embodiment, only one position distribution (i.e., for a single measurement setting; e.g., an illumination setting such as a wavelength/polarization combination) is used, with one or more non-position parameter distributions (e.g., also for a single measurement setting or, as recited, the sum of non-position parameter distributions for more than one measurement setting). Additional terms may be added for different non-position parameters (e.g., distributions for more than one non-position parameter). The measurement settings may vary in more than wavelength/polarization; for example, measurement settings may vary in one or more of (in any combination): wavelength, polarization, the angular distribution of the illumination, the spatial and/or temporal coherence properties of the illumination. For other tools, such as a scanning probe microscope, the varied measurement setting may be any appropriate for the tool in question (e.g., the electron acceleration voltage for an SEM, the force of the tip on the sample for an atomic force microscope or the acoustic wavelength for an acoustic microscope).

It may be preferred that the measurement data comprises only pre-exposure measurement data, to enable wafer-to-wafer corrections for target asymmetries to be made. Pre-exposure data may comprise any data performed on a wafer (e.g., per wafer) prior to exposure of a layer; e.g., data measured using an alignment sensor, as opposed to post-exposure measurement data measured on the exposed wafer (e.g., overlay metrology). However, the scope of this disclosure may also include the use of some post-exposure measurement data.

The result is a weighted corrected position map $X_{COmap}$ with minimum variations within the target, or minimum variations with respect to a nominal target shape. In the latter case, the nominal target shape may be an average target shape or designed target shape. In this manner, target-to-target variations (for nominally similar targets) can be minimized. The weighing factors can be determined by the mark measurement itself, and does not need to rely on other external data sources, such as simulations, measured overlay values, wafer shapes, etc.

In a preferred embodiment, the weighting optimization may be subject to the constraint $\Sigma C_{\lambda,P}=1$. This prevents removing the average value from the combined map, which would likely result in a position error. For example, if the weighted position map $X_{COmap}$ was determined from two identical position maps relating to two wavelengths, such that both maps show the same pattern comprising the same variations between n+1 nm and n−1 nm. It would be straightforward to subtract these measurements, resulting in a combined measurement with zero variations, but with the average value n having been removed, where n is very possibly the correct value.

Figure 8:
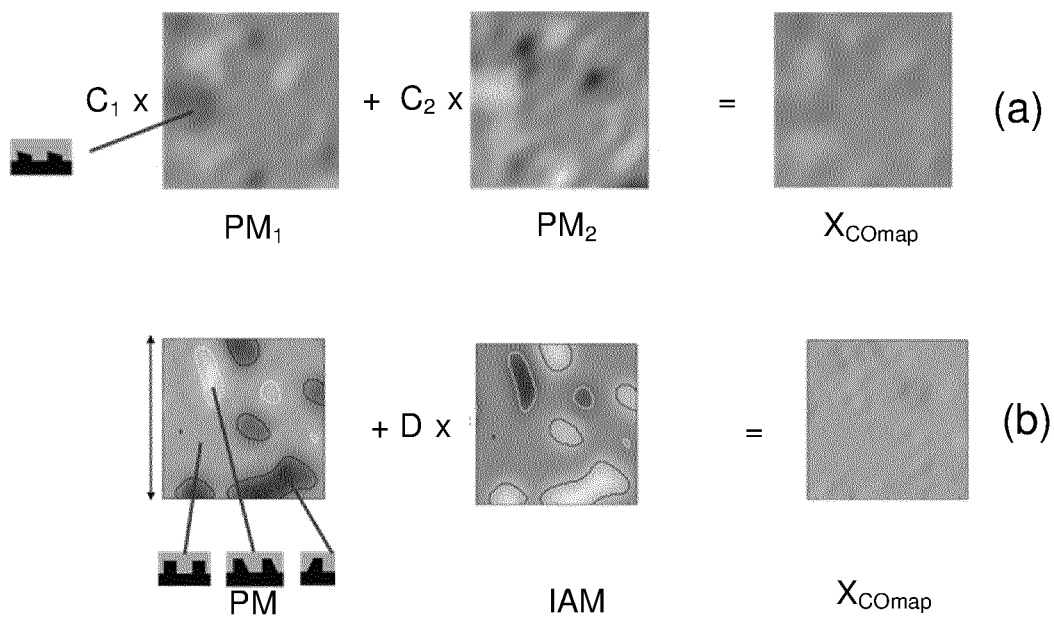
FIG. 8 conceptually illustrates (a) a weighting determination for position distributions according to an embodiment of the invention and (b) a weighting determination for a position distribution and a non-position parameter distribution according to an embodiment of the invention.

FIG. 8(a) conceptually illustrates the optimization of weighting coefficients $C_1$, $C_2$ based on two position distributions or local position maps $PM_1$, $PM_2$ corresponding to first wavelength $\lambda_1$ and second wavelength $\lambda_2$ respectively, so as to minimize variation in the combined weighted position map $X_{COmap}$. As already described, the weighting coefficients $C_1$, $C_2$ may be also a function of (for example) pixel index or mark coordinate. This approach is shares some similarities with OCW, but self-referenced and not relying on external data or training.

FIG. 8(b) conceptually illustrates the optimization of weighting coefficient D based on one position distribution or local position map PM and a non-position parameter map IAM (e.g., a local intensity asymmetry map describing a difference between intensities of corresponding pixels of a +1 diffraction order and −1 diffraction order having diffracted from the target) so as to minimize variation in the weighted position map $X_{COmap}$. Such an approach effectively determines the weighting factor D such that the weighted non-position parameter map IAM can correct the local position map PM to determine the weighted position map $X_{COmap}$. In an embodiment, the local position map PM and a non-position parameter map IAM, and therefore the corrected weighted position map $X_{COmap}$, may be obtained from a single measurement. Note that no weighting coefficient C for the position map is determined here because only 1 position measurement is used in this example. Due to the preference that the sum of weighting factors C for the position maps should be 1, the weight for a single position measurement should typically be 1. In general, when there are n position measurements and m other non-position parameter measurements, the weights should all be co-optimized to make the image(s) as flat or close to 'nominal' as possible. Where there are more measurements available (e.g., position maps and/or non-position parameter maps for other measurement settings) then the method may co-optimize weighting factors C and D for both data sets.

Once the weighted position map $X_{COmap}$ has been obtained, a single aligned position $X_{CO}$ (i.e., the corrected position used to determine the alignment correction) may be determined as an average or other statistical measure of the weighted position map $X_{COmap}$. The average may be, for example, a mean of the positions described in the weighted position map (e.g., within a region-of-interest), for example. Other averages which may be used, for example, include median, circular mean or circular median. Outlier removal or other processing techniques may also be employed. Statistical tools, such as a histogram can be made per position map from which an aligned position can be determined. For example, a histogram of pixel count against aligned position bins can be determined from the weighted position map. This histogram can be used to determine the aligned position, via the mean, median, outlier filters, etc.

In an embodiment, a weighted value for the representative position may be determined as:

$$X_{RE} = \Sigma C_{\lambda,P} X_{RE_{\lambda,P}}$$

this can then be used to compute a value for a (single value) alignment correction $\Delta_{AL}$, for example.

Note that Equation 1 may be slightly modified to optimize directly for the offset to find an alignment correction map or distribution $\Delta_{ALmap}$ per target, which can then be averaged to find a single offset value per target $\Delta_{AL}$. Such a modified equation may take the form (where the second term is optional as before, provided that there are multiple position distributions per target):

$$\Delta_{ALmap} = \Sigma C_{\lambda,P}(X_{RE} - X_{COmap})_{\lambda,P} + \Sigma D_{\lambda,P} \hat{O}_{\lambda,P} \qquad \text{Equation 2}$$

where $X_{RE}$ is a single representative position value as described above and $X_{COmap}$ is a corrected position map (e.g., per mark and measurement setting). As such, the difference term $X_{RE} - X_{COmap}$ is in itself a position distribution or map. The alignment correction map $\Delta_{ALmap}$ may be evaluated for all sensor settings applicable for the pre-alignment tool(s) used. As before, the alignment correction $\Delta_{ALmap}$ may be converted to a single value per target by averaging over the target or applicable region thereof to obtain alignment correction $\Delta_{AL}$.

Such an embodiment may be particularly useful where, for example colors are measured sequentially, and/or significant (e.g. on the order of 1 nm) unknown wafer stage position variations occur between measurements. This is because the term $X_{RE_{\lambda,P}}$ provides a mechanism to accommodate these situations (e.g., a different representative position per wavelength).

In either Equation 1 or 2, the weighting factor C, and D when applicable, may be determined for the weighted position map by minimizing a variation metric in the resulting combined position map. More specifically, this can be done in many ways, e.g., according to different norms.

One such method may comprise minimizing variation metric such as variance, e g minimizing $V = \Sigma_{i,j}(\tilde{\Phi}(i,j) - \langle\tilde{\Phi}\rangle)^2$ where $\tilde{\Phi}(i,j)$ is the weighted position map for pixel coordinates (i,j) and $\langle\tilde{\Phi}\rangle$ is the mean over the weighted position map (i.e., mean over all pixels). However, in other embodiments, other norms may be used (e.g. minimizing $V = \Sigma_{i,j}(\tilde{\Phi}(i,j) - \langle\tilde{\Phi}\rangle)^k$ where k could take a different number, e.g. ½, 1 (L1-norm, more tolerant to outliers), 3, 4, or infinite (less tolerant to outliers). To further improve robustness to outliers, portions of a mark for which e.g., no weights can be found to improve the variation metric so that it better matches the rest of the mark or the nominal mark (or for which the weights would be very different from the other weights of the mark) may be discarded entirely.

In further embodiments $\langle\tilde{\Phi}\rangle$ could be replaced by another statistical measure e.g. the median over the position map. Another example may comprise minimizing the variations (rather than the variance). This could be done in many ways, including manually, judging by eye.

An advantage of an image based measurement apparatus such as illustrated in FIG. 3, is that all the parameter distributions may be obtained from the same images. Such a device may provide two or more images (either separately or combined), each corresponding to a particular measurement setting (e.g., wavelength/polarization combination), from which corresponding local position maps can be determined and weighting factors $C_{\lambda,P}$ calculated which minimize variation/variance (e.g., based on the first term of Equation 1 or 2). Additionally, the same image can be used to yield non-position parameter distributions/maps as described, such that the weighting optimization may optimize weighting factors $C_{\lambda,P}, D_{\lambda,P}$ based on both terms of Equation 1 or 2, for a more robust alignment measurement.

In an embodiment, the weighing factors may be determined per target or mark. However such an approach may be impacted by, e.g., sensor noise and uncorrected mark process noise. Therefore, it may be more robust to use average weighting factors over a portion of the wafer, the entire wafer or over multiple wafers (e.g., a lot). The average may be a mean, median, or any other statistical measure. Such a method may comprise jointly determining the weighting factors for the corresponding images of each mark to minimize variance/variations in a combined position map corresponding to the multiple marks.

The more measurement settings or wavelengths used or more of other different types of other data may result in a better estimator for the aligned position. In some cases, depending on the stack geometry and the type of deformations, minimizing the variations may result in an overall offset from the ideal position of the mark, caused by e.g. insufficient different wavelengths for a particular stack. This can be partly corrected by using other sources, such as wafer or lot statistics, overlay feedback loop, etc., or else measuring with more wavelengths.

It can be appreciated that key performance indicators (KPIs) can be extracted from the position map, e.g., to check the quality of the mark for process monitoring and control. Such KPIs may be determined, for example, from an aforementioned histogram of pixel count against aligned position bins. In this context, the determined coefficients C and/or D can also be used as KPIs for process monitoring.

Equation 1 is described as a linear superposition of observables $\hat{x}$ and/or $\hat{O}$. Similarly, Equation 2 is described as a linear superposition of observables $(X_{RE}-X_{COmap})$ and/or $\hat{O}$. However, in either case nonlinear terms may also be included in the optimization, such as quadratic, or cubic terms, and/or higher orders.

It may be desirable that the weighting factors C and/or D are dependent on the position of the target (select smaller ROIs in the position/non-position parameter maps for which weighting factors C and/or D are optimized). For example, the weighting factors C and/or D may vary within the target (or may vary as function of pixel index), e.g. a different weighting may be assigned to targets in a region at the edge of the target compared to a region at the center of the target. As such, while embodiments above largely focus on determining weights per camera pixel (or group of pixels), it is also possible and within the scope of the disclosure to determine weight per location within the target (e.g. as function of distance from edge of target). In theory these may be different when a target is measured at a slightly different location with respect to the camera, although in practice this difference is typically small.

While the above description may describe the proposed concept in terms of determining alignment corrections for alignment measurements, the concept may be applied to corrections for one or more other parameters of interest; e.g., which may be measured using an alignment sensor. For example, the pre-alignment metrology tool (or pre-measurement metrology tool more generally) may be used as a correction station for overlay techniques which compare the difference in positions of two or more gratings. For example, it is possible to determine overlay by comparing the position of two (e.g., large) gratings with respect to each other, where each grating is in a different layer. The concepts disclosed herein may provide improved values for the established position of each grating and therefore a better determined overlay.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The embodiments may further be described using the following clauses:

1. A metrology system comprising:
    a pre-alignment metrology tool operable to measure a plurality of targets on a substrate to obtain measurement data; and
    a processing unit being operable to:
    process said measurement data to determine for each target at least one position distribution which describes variation of said position value over at least part of said target; and
    determine a measurement correction from said at least one position distribution which corrects for within-target variation in each of said targets, said measurement correction for correcting measurements performed by an alignment sensor.

2. A metrology system of clause 1, wherein the measurement correction comprises at least one independent respective measurement correction for each target.

3. A metrology system of clause 1 or 2, wherein the measurement correction comprises a plurality of independent respective measurement corrections for each target or a subset thereof.

4. A metrology system of clause 3, wherein each of said plurality of independent respective measurement corrections for each target corresponds to a respective measurement setting.

5. A metrology system of any preceding clause, wherein the processing unit is operable to determine said measurement correction, for each target, as a respective difference or comparison of at least representative position value uncorrected for said within-target variation and a corrected position value corrected for said within-target variation.

6. A metrology system of clause 5, wherein the processing unit is operable to determine, for each target, said representative position value as an average position of the respective at least one position distribution for that target.

7. A metrology system of clause 5 or 6, wherein said respective difference or comparison comprises for each target, a difference of: a first statistical measure of the position distribution and a second statistical measure of the same position distribution.

8. A metrology system of clause 7, wherein the processing unit is further operable to determine said corrected position value as a median position value of the respective at least one position distribution for that target and said representative position value as an average position of the respective at least one position distribution for that target.

9. A metrology system of any of clauses 1 to 6, wherein said processing unit is operable to process said measurement data to determine at least two parameter distributions including said at least one position distribution.

10. A metrology system of clause 9, wherein said processing unit is operable to determine, for each target, at least one weighting factor for at least one of at least two parameter distributions to obtain a corresponding corrected position distribution comprising a combination of said at least two parameter distributions subject to said weighting factor(s), wherein the weighting factor(s) minimizes a variation metric in the corrected position distribution.

11. A metrology system of clause 10, wherein said processing unit is operable to determine said corrected position value per target from each respective corrected position distribution per target.

12. A metrology system of clause 11, wherein said processing unit is operable to determine said corrected position value per target as an average of each respective corrected position distribution per target.

13. A metrology system of clause 10, wherein the at least one position distribution comprises at least one difference distribution comprising said representative position value and said corrected position distribution.

14. A metrology system of clause 13, wherein the result of said minimization is an measurement correction distribution per target and said processing unit is further operable to determine said measurement correction per target from each respective correction distribution per target.

15. A metrology system of clause 14, wherein the processing unit is further operable to determine said measurement correction per target as an average of each respective correction distribution per target.

16. A metrology system of any of clauses 10 to 15, wherein the variation metric comprises variation or variance within the target and/or with respect to a nominal target.

17. A metrology system of any of clauses 10 to 12, wherein processor is operable to constrain the sum of any weighting factors assigned to said at least one position distribution to equal one.

18. A metrology system of any of clauses 10 to 17, wherein said weighting factor for at least one of said at least two parameter distributions is dependent on a position within the target and/or within an image of the target.

19. A metrology system of any of clauses 10 to 18, wherein said processor is further operable to determine separate weighting factors for each of said parameter distributions.

20. A metrology system of any of clauses 9 to 19, wherein the at least two parameter distributions comprise at least two position distributions, each relating to a different measurement setting.

21. A metrology system of any of clauses 9 to 20, wherein the at least two parameter distributions comprise at least one non-position parameter distribution, which describes variation of said non-position parameter value over at least part of said at least one target.

22. A metrology system of clause 21, wherein the non-position parameter comprises one or more of: intensity asymmetry between complementary diffraction orders, fringe visibility of a pattern within an image of the target, local intensity, wafer quality, and amplitude of a pattern within an image of the target.

23. A metrology system of clause 21 or 22, wherein the at least one non-position parameter distribution comprise a plurality of non-position parameter distributions, each relating to a different measurement setting.

24. A metrology system of any preceding clause, wherein said measurement correction comprises an alignment correction for correcting alignment measurements performed by the alignment sensor.

25. A metrology system of any of clauses 1 to 23, wherein said measurement correction comprises a correction for a parameter of interest other than alignment performed using said alignment sensor.

26. A metrology system of clause 25, wherein said parameter of interest comprises overlay.

27. A metrology system of any preceding clause, wherein the pre-alignment metrology tool is configured to produce measurement illumination comprising a plurality of illumination beams of measurement illumination, each of said illumination beams being spatially incoherent or pseudo-spatially incoherent and comprising multiple pupil points in an illumination pupil of the metrology device, wherein for the illumination beams corresponding to at least each considered measurement direction, each pupil point in each one of said plurality of illumination beams has a corresponding pupil point in the other illumination beams of said plurality of illumination beams thereby defining multiple sets of corresponding pupil points, and wherein the pupil points of each set of corresponding pupil points are spatially coherent with respect to each other.

28. A metrology system of clause 27, wherein each pupil point is substantially spatially incoherent with respect to all other pupil points in the same illumination beam; and wherein each set of pupil points is a geometric translation of all other sets of pupil points within said illumination pupil, at least for the illumination beams corresponding to a considered measurement direction.

29. A metrology system of clause 27 or 28, wherein the pre-alignment metrology tool comprises an off-axis illumination generator to generate the plurality of illumination beams of measurement illumination from a single beam of incoherent radiation.

30. A metrology system of clause 29, wherein off-axis illumination generator comprises one of:
   a phase grating per measurement direction or a 2D phase grating;
   a pair of phase gratings per measurement direction or 2D phase grating, a pair of lenses and a pair of optical wedges in a Fourier plane defined by one of said pair of lenses, arranged such that different wavelengths within each illumination beam have a shared incident illumination angle; or
   a plurality of beam splitter and reflector components arranged to generate four identical illumination beams from said single beam of incoherent radiation, and such that different wavelengths within each illumination beam have a shared incident illumination angle.

31. A metrology system of any of clauses 27 to 30, wherein each illumination beam is located in the illumination pupil, such that a corresponding higher diffraction order is captured in a detection pupil of the metrology device for each illumination beam, following scattering of said measurement illumination by a target.

32. A metrology system of clause 31, wherein said plurality of illumination beams comprises a pair of illumination beams per considered measurement direction, and the corresponding higher diffraction orders captured comprise complementary higher diffraction orders for each direction.

33. A metrology system of clause 32, wherein:
   the pupil points of each set of corresponding pupil points are spatially coherent with respect to each other for all of said plurality of illumination beams; or
   the pupil points of each set of corresponding pupil points are spatially coherent with respect to each other for only each pair of illumination beams corresponding to a single of said considered measurement directions.

34. A metrology system of clause 32 or 33, wherein the metrology device is operable in a dark field configuration such that a zeroth order of scattered radiation is not detected.

35. A lithography system comprising:
   the metrology system of clause 24; and
   an alignment sensor operable to measure said plurality of targets to obtain alignment data;

wherein said processing unit is operable to apply said alignment correction to said alignment data to obtain corrected alignment data.

36. A lithography system of clause 35, wherein the lithography system comprises a lithographic exposure station operable to use said corrected alignment data in the positioning said a substrate comprising said plurality of targets for a lithographic exposure process.

The invention claimed is:

1. A metrology system comprising:
a pre-alignment metrology tool configured to measure a plurality of targets on a substrate to obtain measurement data; and
a processing unit configured to:
process the measurement data to determine for each target at least one position distribution that describes variation of the position value over at least part of the target; and
determine a measurement correction from the at least one position distribution that corrects for within-target variation in each of the targets, the measurement correction being used to correct measurements performed by an alignment sensor.

2. The metrology system of claim 1, wherein the measurement correction comprises at least one independent respective measurement correction for each target.

3. The metrology system of claim 1, wherein the measurement correction comprises a plurality of independent respective measurement corrections for each target or a subset thereof.

4. The metrology system of claim 3, wherein each of the plurality of independent respective measurement corrections for each target corresponds to a respective measurement setting.

5. The metrology system of claim 1, wherein the processing unit is operable to determine the measurement correction, for each target, as a respective difference or comparison of at least representative position value uncorrected for the within-target variation and a corrected position value corrected for the within-target variation.

6. The metrology system of claim 1, wherein the processing unit is configured to process the measurement data to determine at least two parameter distributions including the at least one position distribution.

7. The metrology system of claim 6, wherein the processing unit is configured to determine, for each target, at least one weighting factor for at least one of at least two parameter distributions to obtain a corresponding corrected position distribution comprising a combination of the at least two parameter distributions subject to the weighting factor(s), wherein the weighting factor(s) minimizes a variation metric in the corrected position distribution.

8. The metrology system of claim 6, wherein the at least two parameter distributions comprise at least one non-position parameter distribution, that describes variation of a non-position parameter value over at least part of at least one target.

9. The metrology system of claim 8, wherein the non-position parameter comprises one or more of: intensity asymmetry between complementary diffraction orders, fringe visibility of a pattern within an image of the target, local intensity, wafer quality, and amplitude of a pattern within an image of the target.

10. The metrology system of claim 1, wherein the measurement correction comprises an alignment correction that corrects alignment measurements performed by the alignment sensor.

11. A lithography system comprising:
the metrology system as claimed in claim 10; and
an alignment sensor configured to measure the plurality of targets to obtain alignment data;
wherein the processing unit is configured to apply the alignment correction to the alignment data to obtain corrected alignment data.

12. The lithography system as claimed in claim 11, wherein the lithography system comprises a lithographic exposure station configured to use the corrected alignment data in positioning the substrate comprising the plurality of targets for a lithographic exposure process.

13. The metrology system of claim 1, wherein the measurement correction comprises a correction for a parameter of interest other than alignment performed using the alignment sensor.

14. The metrology system as claimed in claim 13, wherein the parameter of interest comprises overlay.

15. The metrology system of claim 1, wherein the pre-alignment metrology tool is configured to produce measurement illumination comprising a plurality of illumination beams of measurement illumination, each of the illumination beams being spatially incoherent or pseudo-spatially incoherent and comprising multiple pupil points in an illumination pupil of the metrology device, wherein for the illumination beams corresponding to at least each considered measurement direction, each pupil point in each one of the plurality of illumination beams has a corresponding pupil point in the other illumination beams of the plurality of illumination beams thereby defining multiple sets of corresponding pupil points, and wherein the pupil points of each set of corresponding pupil points are spatially coherent with respect to each other.

* * * * *